(12) United States Patent
Yoshida et al.

(10) Patent No.: US 9,643,559 B2
(45) Date of Patent: May 9, 2017

(54) PRESSURE DETECTING DEVICE FOR VEHICLE

(71) Applicant: DENSO CORPORATION, Kariya, Aichi-pref. (JP)

(72) Inventors: Masatada Yoshida, Ichinomiya (JP); Makoto Sakai, Kariya (JP)

(73) Assignee: DENSO CORPORATION, Kariya, Aichi-pref. (JP)

(*) Notice: Subject to any disclaimer, the term of this patent is extended or adjusted under 35 U.S.C. 154(b) by 57 days.

(21) Appl. No.: 14/567,425

(22) Filed: Dec. 11, 2014

(65) Prior Publication Data
US 2015/0165999 A1 Jun. 18, 2015

(30) Foreign Application Priority Data
Dec. 16, 2013 (JP) ................................. 2013-259282

(51) Int. Cl.
*B60R 21/0136* (2006.01)
*G01M 17/007* (2006.01)

(52) U.S. Cl.
CPC ..... *B60R 21/0136* (2013.01); *G01M 17/0078* (2013.01)

(58) Field of Classification Search
None
See application file for complete search history.

(56) References Cited

U.S. PATENT DOCUMENTS

| 2001/0028072 | A1 | 10/2001 | Aoki et al. |
| 2005/0222487 | A1* | 10/2005 | Miller, III ............ H04R 25/604 600/25 |
| 2007/0051599 | A1 | 3/2007 | Takehara et al. |
| 2015/0051511 | A1* | 2/2015 | Heerah .................... A61B 7/04 600/586 |

FOREIGN PATENT DOCUMENTS

| JP | 2001-153746 | 6/2001 |
| JP | 2005-283587 | 10/2005 |
| JP | 2007-071596 | 3/2007 |

* cited by examiner

*Primary Examiner* — Robert R Raevis
(74) *Attorney, Agent, or Firm* — Harness, Dickey & Pierce, P.L.C.

(57) ABSTRACT

In a pressure detecting device for a vehicle, a first detection member is fixed to a sensor housing such that a first surface of a first diaphragm faces a closed space of the vehicle and a first chamber isolated from the closed space is provided to face a second surface of the first diaphragm. A second detection member is fixed to the sensor housing such that a first surface of a second diaphragm faces the closed space, and a second chamber is provided to face a second surface of the second diaphragm. When the first diaphragm and the second diaphragm are deformed by the same amount and in the same direction, the first detection member and the second detection member output signals having the same value with opposite signs. The first surface of the first diaphragm and the first surface of the second diaphragm are covered with a protection member.

11 Claims, 8 Drawing Sheets

PRESSURE DETECTING DEVICE FOR VEHICLE

CROSS REFERENCE TO RELATED APPLICATION

This application is based on Japanese Patent Application No. 2013-259282 filed on Dec. 16, 2013, the disclosure of which is incorporated herein by reference.

TECHNICAL FIELD

The present disclosure relates to a pressure detecting device for a vehicle.

BACKGROUND

For example, JP 2007-71596 A, which corresponds to US 2007/0051599 A1, discloses a collision detecting apparatus for a vehicle. The collision detecting apparatus includes a pressure sensor disposed in the inside of a vehicle side door to detect a change in pressure inside of the side door caused by deformation of the side door in the event of a collision. The collision detecting apparatus detects a side collision of the vehicle based on the change in pressure detected by the pressure sensor. When the collision is detected, side airbags and the like are activated to protect an occupant from an impact of the collision.

In the event of the collision to the side door, the increase in pressure inside of the side door due to the deformation and vibrations of a side door member due to the impact of the collision and the travelling of the vehicle are likely to occur simultaneously. Therefore, a pressure sensor used for such a collision detecting apparatus is applied with the increase in pressure and the vibrations in a superimposed manner. As such, a detection value of the pressure sensor contains the influences by the increase in pressure and the vibrations, and thus it is difficult to accurately detect only the change in pressure inside of the side door.

The collision detecting apparatus of JP 2007-71596 A has the pressure sensor and a vibration sensor. The pressure sensor has a diaphragm disposed to face a closed space provided inside of the side door. The vibration sensor has a diaphragm isolated from the closed space. A detection value of the vibration sensor is subtracted from the detection value of the pressure sensor so as to remove the influence by the vibration of the side door from the detection value of the pressure sensor.

SUMMARY

In the collision detecting apparatus of JP 2007-71596 A, the diaphragm of the pressure sensor is covered with a protection member, which is made of a synthetic resin, whereas the diaphragm of the vibration sensor is not covered with the protection member. Therefore, although the influence by the vibrations of the diaphragms of the pressure sensor and the vibration sensor can be removed, it was difficult to remove the influence by the vibration of the protection member. Specifically, the protection member is necessary to protect electronic components of the pressure sensor. It has been highly required to improve accuracy of collision detection. As a result, the influence by the vibration of the protection member to the detection value has been increased.

It is an object of the present disclosure to provide a pressure detecting device that is capable of accurately detecting only a change in pressure generated in a vehicle.

According to an aspect of the present disclosure, a pressure detecting device for a vehicle includes a sensor housing, a first detection member, a second detection member, and a protection member. The first detection member includes a first diaphragm. The first detection member is fixed to the sensor housing such that a first surface of the first diaphragm faces a closed space of the vehicle and a first chamber that is isolated from the closed space is provided to face a second surface of the first diaphragm. The first detection member outputs a signal when the first diaphragm is deformed according to a pressure in the closed space. The second detection member includes a second diaphragm. The second detection member is fixed to the sensor housing such that a first surface of the second diaphragm faces the closed space, and a second chamber is provided to face a second surface of the second diaphragm. When the second diaphragm is deformed by the same amount and in the same direction as the first diaphragm, the second detection member outputs a signal having a same value as a signal outputted from the first detection member but having an opposite sign from that of the signal outputted from the first detection member. The protection member is filled in the sensor housing and covers the first surface of the first diaphragm and the first surface of the second diaphragm.

In such a structure, the first detection member outputs a signal containing both of a component of a change in pressure of the closed space and components of impulsive vibrations of the first diaphragm and the protection member covering the first diaphragm. The second detection member outputs a signal containing components of impulsive vibrations of the second diaphragm and the protection member covering the second diaphragm. Between the signal outputted from the first detection member and the signal outputted from the second detection member, the components of the impulsive vibrations of second diaphragm and the protection member are same in magnitude but are opposite in positive and negative signs. Therefore, the influence by the impulsive vibrations can be removed from the signals outputted from the first detection member and the second detection member by adding the signal outputted from the first detection member and the signal outputted from the second detection member. As such, the change in pressure generated in the closed space can be accurately detected.

In particular, the first detection member and the second detection member are both covered with the protection member. Therefore, by adding the signal outputted from the first detection member and the signal outputted from the second detection member, the influence by the impulsive vibration of the protection member can be removed from the detection values of the first detection member and the second detection member, in addition to the removal of the influence by the impulsive vibration of the first diaphragm and the second diaphragm. As such, the accuracy of detection of the change in pressure of the closed space can be further improved.

When the first diaphragm and the second diaphragm are deformed by the same amount and in the same direction, the first detection member and the second detection member output the signals that are same in magnitude but with opposite signs. In this case, the signals outputted from the first detection member and the second detection member may have some variations as long as the variations do not affect in the removal of the influence by the impulsive vibrations by adding the signals outputted from the first detection member and the second detection member.

BRIEF DESCRIPTION OF THE DRAWINGS

The above and other objects, features and advantages of the present disclosure will become more apparent from the following detailed description made with reference to the accompanying drawings, in which like parts are designated by like reference numbers and in which.

DETAILED DESCRIPTION

First Embodiment

A pressure sensor structure unit SE and an airbag system including the pressure sensor structure unit SE according to a first embodiment of the present disclosure will be described with reference to FIGS. 1 to 5.

Figure 2:
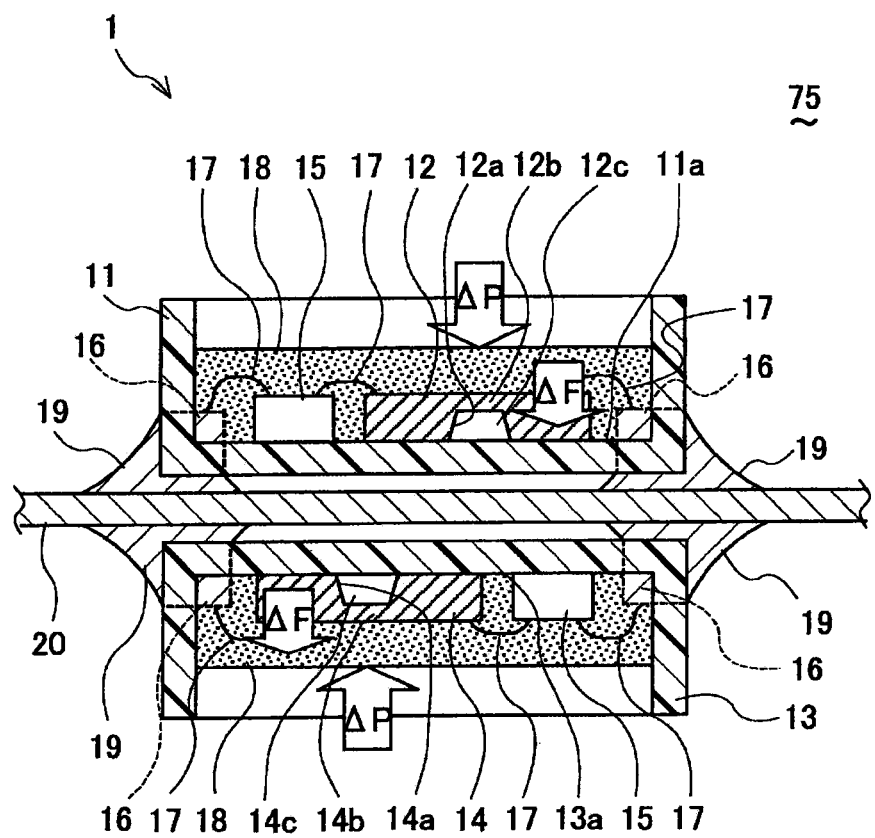
FIG. 2 is a cross-sectional view of a pressure sensor of the pressure sensor structure unit shown in FIG. 1.

The pressure sensor structure unit SE includes a pressure sensor 1. In the following description of a structure of the pressure sensor 1, for the convenience of explanation, an upper side in FIG. 2 is referred to as an upper side of the pressure sensor 1, and a lower side in FIG. 2 is referred to as a lower side of the pressure sensor 1. However, the upper side and the lower side are irrelevant to an actual fixing direction of the pressure sensor 1 to a vehicle.

Figure 1:
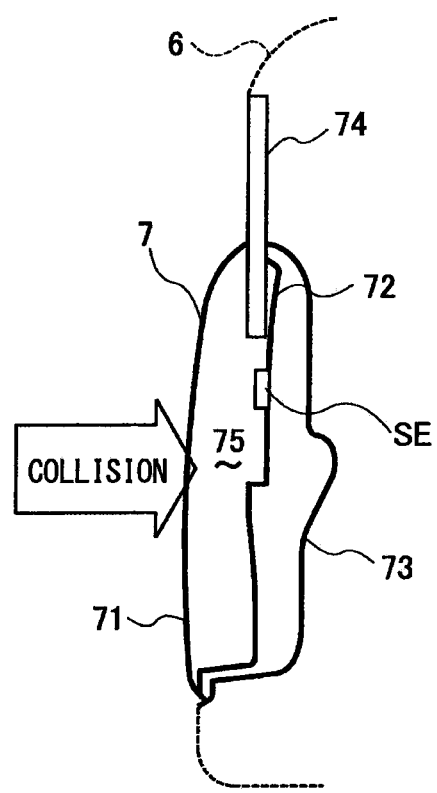
FIG. 1 is a schematic cross-sectional view of a door of a vehicle to which a pressure sensor structure unit according to a first embodiment of the present disclosure is fixed.

As shown in FIG. 1, a side door 7 of a vehicle 6 has an outer panel 71 and an inner panel 72. The outer panel 71 is located at a side end of the vehicle 6, and provides a side end surface of the vehicle 6. The inner panel 72 is opposed to the outer panel 71 on a passenger compartment side of the outer panel 71.

Each of the outer panel 71 and the inner panel 72 is formed by press-forming from a steel plate. The outer panel 71 and the inner panel 72 are integrated with each other by welding an outer peripheral end of the outer panel 71 and an outer peripheral end of the inner panel 72 to each other.

A door trim 73 is engaged to the inner panel 72 on a passenger compartment side of the inner panel 72. The door trim 73 is made of a synthetic resin.

A window glass 74 projects from an upper end of the door 7. The window glass 74 is movable in an up and down direction between the outer panel 71 and the inner panel 72.

Inside of the door 7, a closed chamber 75 is provided by the outer panel 71, the inner panel 72 and the window glass 74. The closed chamber 75 corresponds to a closed space. It is not always necessary that the closed chamber 75 is a fully closed space to resist to external high pressure. The closed chamber 75 may be isolated from the outside with a sealing force that can restrict entry of raindrops. The closed chamber 75 may be in communication with the outside through a drainage hole formed at the lower part of the door 7.

The pressure sensor structure unit SE is fixed to the inner panel 72. The pressure sensor structure unit SE is fixed to face the closed chamber 75. The pressure sensor structure unit SE is disposed to detect an increase (change) in pressure inside of the closed chamber 75 that is caused by compression of the door 7 when the door 7 is deformed by a collision.

The pressure sensor 1 of the pressure sensor structure unit SE corresponds to a pressure detecting device for a vehicle. The pressure sensor 1 is a semiconductor pressure sensor. As shown in FIG. 2, the pressure sensor 1 includes a first sensor chip 12 and a second sensor chip 14. The first sensor chip 12 is a semiconductor pressure sensor device. The first sensor chip 12 is disposed in a first housing 11 made of a synthetic resin. The second sensor chip 14 is a semiconductor pressure sensor device. The second sensor chip 14 is disposed in a second housing 13 made of a synthetic resin.

The first housing 11 and the second housing 13 are disposed in such a manner that a bottom wall 11a of the first housing 11 and a bottom wall 13a of the second housing 13 are opposed to each other through a sensor substrate 20. The first sensor chip 12 is fixed to the bottom wall 11a of the first housing 11. The second sensor chip 14 is fixed to the bottom wall 13a of the second housing 13. The first sensor chip 12 and the second sensor chip 14 are disposed in opposite directions with respect to a vertical direction of FIG. 2, such as a direction perpendicular to a sensor substrate 20.

The first housing 11 and the second housing 13 form a sensor housing. The first sensor chip 12 corresponds to a first detection member. The second sensor chip 14 corresponds to a second detection member.

Each of the first sensor chip 12 and the second sensor chip 14 is made of a silicon chip. The first sensor chip 12 has a first recess 12a on its lower surface. A first diaphragm 12b is formed at a bottom (top side in FIG. 2) of the first recess 12a.

The second sensor chip 14 has a second recess 14a on its upper surface. A second diaphragm 14b is formed at a bottom of the second recess 14a. The second diaphragm 14b has the same shape as the first diaphragm 12b.

The first diaphragm 12b and the second diaphragm 14b can be deformed in directions perpendicular to a planar direction thereof, such as in an upward direction and a downward direction in FIG. 2.

The first sensor chip 12 is fixed to the bottom wall 11a of the first housing 11 such that a first chamber 12c (air chamber) is provided between the first housing 11 and the first diaphragm 12b. As shown in FIG. 2, the first chamber 12c is isolated from the closed chamber 75. By such a structure, the first diaphragm 12b is disposed in such a manner that a first surface (upper surface in FIG. 2) faces the closed chamber 75 through a protection member 18 and a second surface (lower surface in FIG. 2) opposite to the first surface faces the first chamber 12c.

The second sensor chip 14 is fixed to the bottom wall 13a of the second housing 13 such that a second chamber 14c (air space) is provided between the second housing 13 and the second diaphragm 14b. As shown in FIG. 2, the second chamber 14c is isolated from the closed chamber 75. By such a structure, the second diaphragm 14b is disposed in such a manner that a first surface (lower surface in FIG. 2) faces the closed chamber 75 through a protection member 18 and a second surface (upper surface in FIG. 2) opposite to the first surface faces the second chamber 14c.

A circuit chip 15, which is made of a silicon chip, is disposed on the bottom wall 11a of the first housing 11. The circuit chip 15 and the first sensor chip 12 are arranged in a horizontal direction of FIG. 2. In other words, the circuit chip 15 and the first sensor chip 12 are arranged in a planar direction of the bottom wall 11a.

A plurality of electrodes 16 is provided at corner portions in the first housing 11. Bonding wires 17 connect between the electrodes 16 and the first sensor chip 12, between the electrodes 16 and the circuit chip 15, and between the first sensor chip 12 and the circuit chip 15. The protection member 18 is filled in the first housing 11 to cover the first sensor chip 12, the circuit chip 15, the electrodes 16 and the bonding wires 17, which are disposed in the first housing 11, from the top. The protection member 18 is made of a fluorine-based gel, which is a fluorine-based resin material.

A circuit chip 15, which is made of a silicon chip, is disposed on the bottom wall 13a of the second housing 13. The circuit chip 15 and the second sensor chip 14 are arranged in the horizontal direction of FIG. 2. In other words, the circuit chip 15 and the second sensor chip 14 are arranged in a planar direction of the bottom wall 13a.

A plurality of electrodes 16 is provided at corner portions in the second housing 13. Bonding wires 17 connect between the electrodes 16 and the second sensor chip 14, between the electrodes 16 and the circuit chip 15, and between the second sensor chip 14 and the circuit chip 15. The protection member 18 is also filled in the second housing 13 to cover the second sensor chip 14, the circuit chip 15, the electrodes 16 and the bonding wires 17, which are disposed in the second housing 13, from the lower side of the second housing 13.

Each of the electrodes 16 disposed in the first housing 11 and the second housing 13 is electrically connected to the sensor substrate 20 through a solder 19. The sensor substrate 20 is fixed to the inner panel 72 through a box member (not shown) of the pressure sensor structure unit SE. With this, the first housing 11 and the second housing 13 are fixed to the door 7 through the sensor substrate 20.

Next, a method for detecting the pressure of the closed chamber 75 by the first diaphragm 12b and the second diaphragm 14b will be described with reference to FIGS. 2 to 4.

Figure 3:
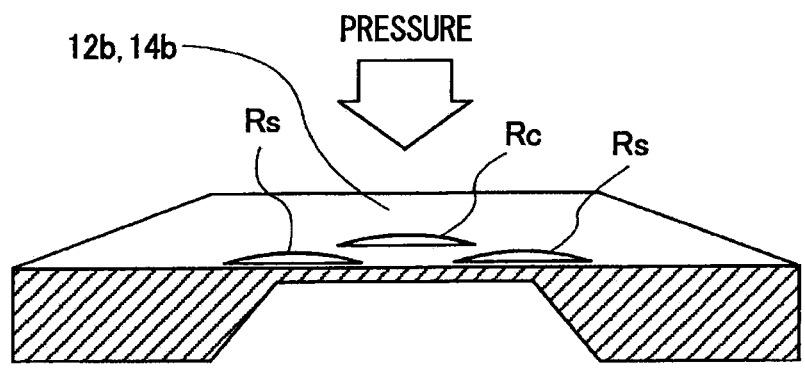
FIG. 3 is a schematic cross-sectional view of a first diaphragm and a second diaphragm of the pressure sensor.

FIG. 3 illustrates the shape of a diaphragm to represent the first diaphragm 12b and the second diaphragm 14b. In FIG. 3, the diaphragm is shown in the same direction as the first diaphragm 12b shown in FIG. 2. The second diaphragm 14b shown in FIG. 2 is disposed in an opposite direction from the diaphragm shown in FIG. 3.

As shown in FIG. 3, each of the first diaphragm 12b and the second diaphragm 14b is a silicon chip processed to be thin, and is integrally formed with diffused resistors Rc, Rs thereon. The first diaphragm 12b has two diffused resistors Rc and two diffused resistors Rs. The second diaphragm 14b has two diffused resistors Rc and two diffused resistors Rs. Note that, in FIG. 3, one diffused resistor Rc is shown.

When the first diaphragm 12b and the second diaphragm 14b are deformed in a downward direction in FIG. 3 due to the change in pressure generated in the closed chamber 75, resistance values of the diffused resistors Rc, Rs are increased or decreased. When an impulsive vibration occurs in the door 7 due to an impact of a collision or the travelling of the vehicle, the first diaphragm 12b and the second diaphragm 14b are deformed in an upward direction or in the downward direction of FIG. 3. Thus, the resistance values of the diffused resistors Rc, Rs are increased or decreased.

Figure 4:
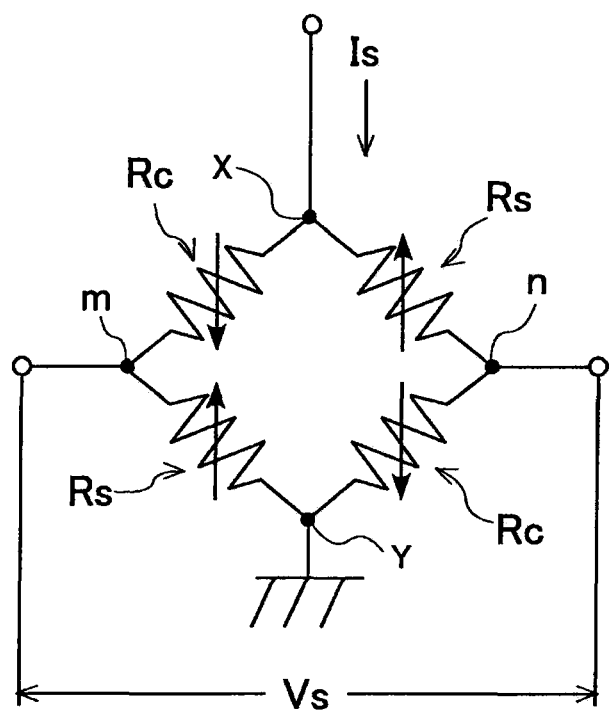
FIG. 4 is a circuit diagram of resistive elements disposed on the first diaphragm and the second diaphragm for pressure detection.

In each of the first diaphragm 12b and the second diaphragm 14b, the diffused resistors Rc, Rs are connected in a manner shown in FIG. 4 to form a Wheatstone bridge. In FIG. 4, the change in pressure generated in the closed chamber 75 can be detected by detecting a voltage Vs (corresponding to a signal) between a connecting point m and a connecting point n in a state where an electric current Is flows from a point X toward a point Y.

That is, when the Wheatstone bridge of the diffused resistors Rc, Rs is in an equilibrium state, the connecting point m and the connecting point n have the same potential. Therefore, the voltage Vs between the connecting point m and the connecting point n is zero.

When the pressure of the closed chamber 75 changes and the first diaphragm 12b and the second diaphragm 14b are deformed in the downward direction of FIG. 3, the resistance value of the diffused resistor Rc reduces, and the resistance value of the diffused resistor Rs increases. In this case, the potential of the connecting point m becomes higher than the potential of the connecting point n. Therefore, the voltage Vs is generated between the connecting point m and the connecting point n according to the amount of deformation of the first diaphragm 12b and the second diaphragm 14b.

When the first diaphragm 12b and the second diaphragm 14b are deformed in the upward direction of FIG. 3 due to the impulsive vibration applied to the door 7, differently from the case described above, the resistance value of the diffused resistor Rc increases and the resistance value of the diffused resistor Rs reduces. With this, the potential of the connecting point n becomes higher than the potential of the connecting point m. Therefore, the voltage Vs is generated between the connecting point m and the connecting point n, in the opposite direction to the case described above, according to the amount of deformation of the first diaphragm 12b and the second diaphragm 14b.

The first diaphragm 12b and the second diaphragm 14b are set to have equal characteristics to each other. Therefore, when the first diaphragm 12b and the second diaphragm 14b are both applied with the impulsive vibration having the same magnitude in the downward direction of FIG. 3, the voltages Vs occur in the first diaphragm 12b and the second diaphragm 14b with the same value (magnitude) and in the same direction. When the first diaphragm 12b and the second diaphragm 14b are both applied with the impulsive vibration having the same magnitude in the upward direction in FIG. 3, the voltages Vs occur in the first diaphragm 12b and the second diaphragm 14b with the same value (magnitude) and in the same direction.

When the first diaphragm 12b and the second diaphragm 14b are applied with the impulsive vibration having the same magnitude, but in opposite directions, such as in the downward direction of FIG. 3 in one of the first diaphragm 12b and the second diaphragm 14b and in the upward direction of FIG. 3 in the other one of the first diaphragm 12b and the second diaphragm 14b, the voltages Vs occur in the first diaphragm 12b and the second diaphragm 14b with the same value (magnitude), but in the opposite directions. The voltages Vs occurring with the same magnitude but in the opposite directions means that the voltages Vs have the same magnitude but have opposite signs.

Hereinafter, in each of the first diaphragm 12*b* and the second diaphragm 14*b*, the voltage Vs occurring between the connecting point m and the connecting point n is referred to as a detection value. The pressure sensor 1 may have any structure other than the structure described hereinabove. For example, the pressure sensor 1 may employ a strain gauge, in place of the diffused resistors Rc, Rs.

Next, a mechanism of action of the pressure generated in the closed chamber 75 due to a collision to the door 7 and the impulsive vibration applied to the door 7 onto the pressure sensor 1 will be described with reference to FIG. 2.

As shown in FIG. 2, each of the first diaphragm 12*b* and the second diaphragm 14*b* can be deformed in the upward and downward directions. In the pressure sensor 1, however, the first sensor chip 12 and the second sensor chip 14 are arranged in opposite directions to each other with respect the direction perpendicular to the sensor substrate 20, such as in the vertical direction in FIG. 2. Therefore, when the first diaphragm 12*b* and the second diaphragm 14*b* are deformed in the same direction in FIG. 2, the first sensor chip 12 and the second sensor chip 14 output the detection values having opposite signs, that is, one being a positive value and the other being a negative value.

As described above, the first chamber 12*c* of the pressure sensor 1 is isolated from the closed chamber 75. The pressure generated in the closed chamber 75 deforms the first diaphragm 12*b* toward the first chamber 12*c*, that is, in the downward direction of FIG. 2 through the protection member 18.

The second chamber 14*c* is also isolated from the closed chamber 75. The pressure generated in the closed chamber 75 deforms the second diaphragm 14*b* toward the second chamber 14*c*, that is, in the upward direction in FIG. 2 through the protection member 18.

In this case, the first diaphragm 12*b* and the second diaphragm 14*b* generate the detection values being same in magnitude but having opposite signs.

The impulsive vibration applied to the door 7 acts on the first diaphragm 12*b* and the second diaphragm 14*b* in the same direction in FIG. 2, irrespective of the arrangement directions of the first diaphragm 12*b* and the second diaphragm 14*b*. Therefore, the impulsive vibration applied to the door 7 causes accelerations to the first diaphragm 12*b* and the protection member 18 covering the first diaphragm 12*b*, thereby deforming the first diaphragm 12*b* in the upward direction or the downward direction of FIG. 2.

Further, the impulsive vibration applied to the door 7 also causes accelerations to the second diaphragm 14*b* and the protection member 18 covering the second diaphragm 14*b*, thereby deforming the second diaphragm 14*b* in the same direction as the direction of deformation of the first diaphragm 12*b*.

As described above, the first diaphragm 12*b* and the second diaphragm 14*b* have the same characteristics, including the thickness of the protection member 18. Therefore, when being applied with the impulsive vibration applied to the door 7, the second diaphragm 14*b* generates the detection value that has the same magnitude as the magnitude of the detection value of the first diaphragm 12*b* but have the positive or negative sign opposite from that of the detection value of the first diaphragm 12*b*.

In the event of collision to the door 7, the first diaphragm 12*b* generates the detection value containing both the pressure of the closed chamber 75 and the components of the impulsive vibrations of the first diaphragm 12*b* and the protection member 18. The second diaphragm 14*b* generates the detection value containing both the pressure of the closed chamber 75 and the components of the impulsive vibrations of the second diaphragm 14*b* and the protection member 18. A detection value based on the components of the impulsive vibrations of the second diaphragm 14*b* and the protection member 18 has a positive or negative sign opposite from that of a detection value based on the components of the first diaphragm 12*b* and the protection member 18.

Figure 5:
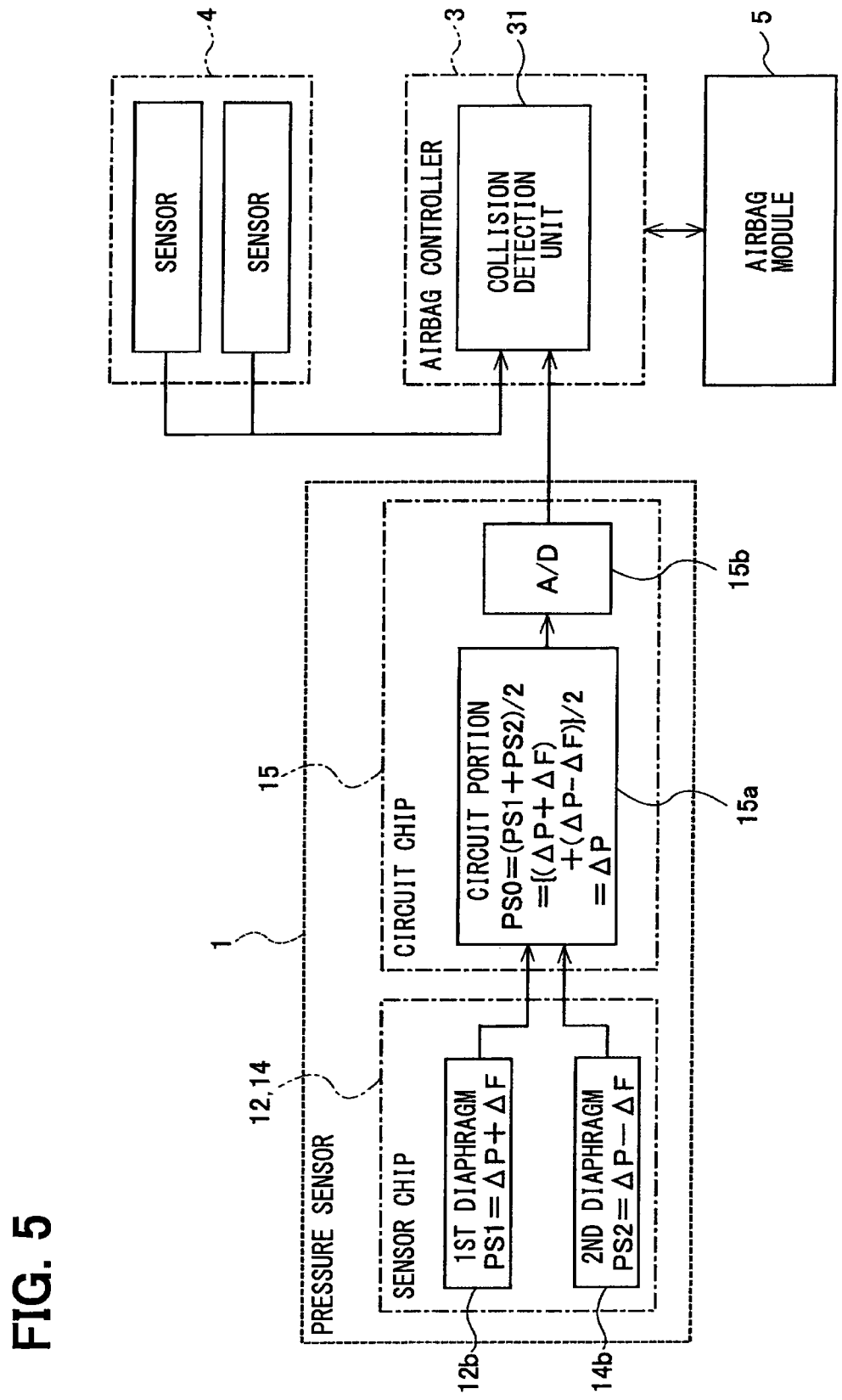
FIG. 5 is a schematic block diagram of an airbag system including the pressure sensor shown in FIG. 2.

Next, an operation of the airbag system including the pressure sensor 1 according to the present embodiment will be described with reference to FIG. 5. One of the circuit chips 15 of the pressure sensor 1 has a circuit portion 15*a* that adds the detection value of the first diaphragm 12*b* and the detection value of the second diaphragm 14*b*. The circuit portion 15*a* corresponds to a calculation circuit. The circuit portion 15*a* is connected to an A/D converter 15*b*, and the A/D converter 15*b* is connected to a collision detection unit 31 of an airbag controller 3. The airbag controller 3 is a controller that is provided by input and output devices, a CPU, a RAM, and the like, which are not shown.

The airbag controller 3 is connected to a sensor group 4. The sensor group 4 includes a plurality of sensors such as another pressure sensor and an acceleration sensor. The airbag controller 3 is connected to an airbag module 5. The airbag module 5 may be similar to a conventional type. The airbag module 5 includes an inflater, a bag, and an igniter, which are not shown.

A detection value PS1 of the first diaphragm 12*b* is the sum of the amount of change $\Delta P$ of pressure of the closed chamber 75 and the amount of change $\Delta F$ due to the impulsive vibrations of the first diaphragm 12*b* and the protection member 18, i.e., $PS1=\Delta P+\Delta F$. The detection value PS1 corresponds to the amount of change in the event of collision relative to a normal time.

A detection value PS2 of the second diaphragm 14*b* is the sum of the amount of change $\Delta P$ of pressure of the closed chamber 75 and the amount of change $-\Delta F$ due to the impulsive vibrations of the second diaphragm 14*b* and the protection member 18, i.e., $PS2=\Delta P-\Delta F$. The detection value PS2 corresponds to the amount of change in the event of collision relative to a normal time.

The circuit portion 15*a* calculates the pressure PS0 (i.e., $PS0=\Delta P$) of the closed chamber 75, i.e., the amount of change of the pressure of the closed chamber 75 by dividing the sum of the detection value PS1 of the first diaphragm 12*b* and the detection value PS2 of the second diaphragm 14*b* by 2. A calculation result of the circuit portion 15*a* is digitalized by the A/D converter 15*b*, and is then transmitted to the collision detection unit 31 of the airbag controller 3.

When the pressure sensor 1 has detected that the pressure of the closed chamber 75 is equal to or greater than a predetermined collision threshold, when another sensor of the sensor group 4 has detected an increase in pressure of another door of the vehicle 6, or when another acceleration sensor has detected an acceleration equal to or greater than a predetermined collision threshold, the collision detection unit 31 detects that a collision has occurred in the vehicle 6, and activates the airbag module 5.

In the first embodiment, the pressure sensor 1 includes the sensor housing, the first sensor chip 12, the second sensor chip 14, and the protection member 18. The sensor housing is provided by the first housing 11 and the second housing 13. The first sensor chip 12 has the first diaphragm 12*b*. The first sensor chip 12 is fixed to the first housing 11 such that the first surface of the first diaphragm 12b faces the closed chamber 75, and the second surface of the first diaphragm 12b faces the first chamber 12c isolated from the closed chamber 75. When the first diaphragm 12b is deformed according to the change in pressure of the closed chamber 75, the first sensor chip 12 generates a signal.

The second sensor chip 14 has the second diaphragm 14b. The second sensor chip 14 is fixed to the second housing 13 such that the first surface of the second diaphragm 14b faces the closed chamber 75, and the second surface of the second diaphragm 14b faces the second chamber 14c. When the second diaphragm 14b is deformed in the same direction as the deformation of the first diaphragm 12b and by the same amount as the deformation of the first diaphragm 12b, the second sensor chip 14 generates a signal having the same magnitude as the signal of the first diaphragm 12b, but having the positive or negative sign opposite from that of the signal of the first diaphragm 12b.

The protection member 18 is filled in the first housing 11 and the second housing 13 to cover the first surface of the first sensor chip 12 and the first surface of the second sensor chip 14.

In such a structure, the first sensor chip 12 outputs a signal in which the change in pressure of the closed chamber 75 and the components of the impulsive vibrations of the first diaphragm 12b and the protection member 18 covering the first diaphragm 12b are mixed. The second sensor chip 14 outputs a signal in which the change in pressure of the closed chamber 75 and the components of the impulsive vibrations of the second diaphragm 14b and the protection member 18 covering the second diaphragm 14b are mixed.

In the signal outputted from the first sensor chip 12 and the signal outputted from the second sensor chip 14, the component of the impulsive vibrations of the first diaphragm 12b and the protection member 18 and the component of the impulsive vibrations of the second diaphragm 14b and the protection member 18 are same in magnitude but have opposite signs. Therefore, the influence by the impulsive vibrations can be removed from the signals of the first sensor chip 12 and the second sensor chip 14 by adding the signal from the first sensor chip 12 and the signal from the second sensor chip 14. As such, the change in pressure generated in the closed chamber 75 can be accurately detected.

The first sensor chip 12 and the second sensor chip 14 are both covered with the protection member 18. Therefore, by adding the signal outputted from the first sensor chip 12 and the signal outputted from the second sensor chip 14, the influence by the impulsive vibration of the protection member 18 can be removed from the detection values of the first sensor chip 12 and the second sensor chip 14, in addition to the removal of the influence by the impulsive vibrations of the first diaphragm 12b and the second diaphragm 14b. As such, the accuracy of detection of the change in pressure of the closed chamber 75 can be further improved.

The pressure sensor 1 includes the circuit portion 15a that adds the detection value of the first diaphragm 12b and the detection value of the second diaphragm 14b. Therefore, the amount of calculations performed in the airbag controller 3 can be reduced, and thus the number of memories of the airbag controller 3 can be reduced.

The closed chamber 75 is provided inside of the door 7. When a collision to the door 7 has occurred, the pressure sensor 1 detects the increase in pressure according to the compression of the closed chamber 75. Therefore, a collision to the door 7 can be accurately detected.

Second Embodiment

Figure 6:
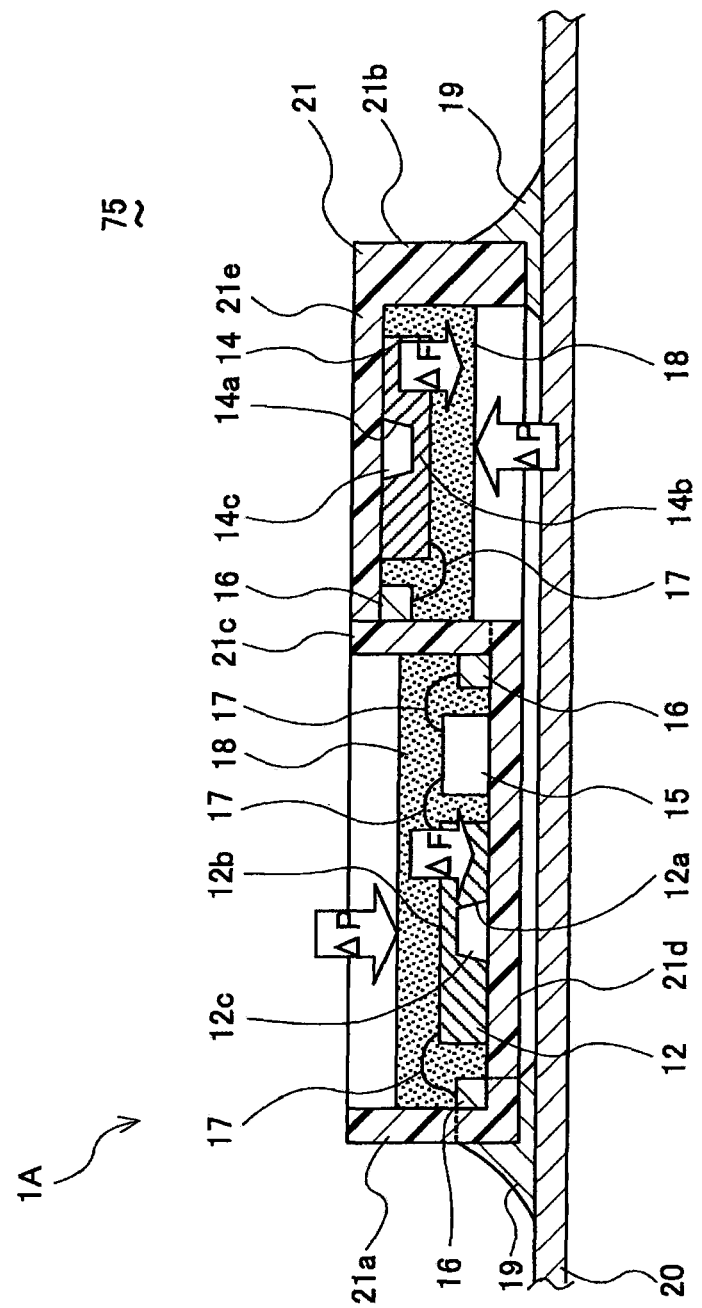
FIG. 6 is a cross-sectional view of a pressure sensor according to a second embodiment of the present disclosure.

A pressure sensor 1A according to a second embodiment of the present disclosure will be hereinafter described with reference to FIG. 6. Hereinafter, points different from the pressure sensor 1 of the first embodiment will be mainly described. In FIG. 6, components similar to those of FIG. 2 are designated with the same reference numbers. In the description of the structures of the pressure sensor 1A, for the convenience of explanation, an upper side in FIG. 6 is referred to as an upper side of the pressure sensor 1A, and a lower side in FIG. 6 is referred to as a lower side of the pressure sensor 1A. However, the upper side and the lower side are irrelevant to an actual fixing direction of the pressure sensor 1A to the vehicle 6.

The pressure sensor 1A has a sensor housing 21 that is integrally formed of a synthetic resin material. As shown in FIG. 6, the sensor housing 21 has a pair of side walls 21a, 21b and a middle wall 21c. The side walls 21a, 21b extend in the up and down direction, and are opposed to each other in a horizontal direction of FIG. 6. The middle wall 21c extends in the up and down direction, and is located between the side wall 21a and the side wall 21b. The sensor housing 21 has a bottom wall 21d between the side wall 21a and the middle wall 21c. The bottom wall 21d extends in the horizontal direction of FIG. 6 and connects the lower end of the side wall 21a and the lower end of the middle wall 21c. The sensor housing 21 further has a top wall 21e extending in the horizontal direction in FIG. 6. The top wall 21e connects the upper end of the side wall 21b and the upper end of the middle wall 21c.

The first sensor chip 12 is fixed to the bottom wall 21d. Similar to the first embodiment, the first sensor chip 12 has the first recess 12a on its lower surface. The first diaphragm 12b is formed at the bottom (upper side) of the first recess 12a. The first chamber 12c is provided between the upper surface of the bottom wall 21d and the first diaphragm 12b. As shown in FIG. 6, the first chamber 12c is isolated from the closed chamber 75.

The second sensor chip 14 is fixed to the lower surface of the top wall 21e. Similarly to the first embodiment, the second sensor chip 14 has the second recess 14a on its upper surface. The second diaphragm 14b is formed at the bottom of the second recess 14a. The second chamber 14c is provided between the lower surface of the top wall 21e and the second diaphragm 14b. As shown in FIG. 6, the second chamber 14c is isolated from the closed chamber 75.

On the bottom wall 21d of the sensor housing 21, the circuit chip 15 is disposed. The circuit chip 15 and the first sensor chip 12 are arranged in the horizontal direction, i.e., in the planar direction of the bottom wall 21d. The plurality of electrodes 16 is disposed at the corner portions of the bottom wall 21d. The bonding wires 17 connect between the electrodes 16 and the first sensor chip 12, between the electrodes 16 and the circuit chip 15, and between the first sensor chip 12 and the circuit chip 15. The protection member 18 is filled in the sensor housing 21 to cover the first sensor chip 12, the circuit chip 15, the electrodes 16 and the bonding wires 17, which are disposed on the bottom wall 21d, from the top.

A plurality of electrodes 16 is also disposed at the corner portions of the top wall 21e. In FIG. 6, only one electrode 16 is shown on the top wall 21e. The electrode 16 and the second sensor chip 14 are connected to each other through a boding wire 17, and the second sensor chip 14 is also connected to the circuit chip 15 disposed on the bottom wall 21d. The protection member 18 is filled in the sensor housing 21 to cover the second sensor chip 14, the electrodes 16 and the bonding wires 17, which are disposed on the lower surface of the top wall 21e, from the lower side.

Each of the electrodes 16 disposed in the sensor housing 21 is electrically connected to the sensor substrate 20 through the solder 19. The sensor substrate 20 is fixed to the inner panel 72, and the sensor housing 21 is fixed to the door 7 through the sensor substrate 20. The pressure sensor 1A is fixed to the door 7 such that the up and down direction in FIG. 6 corresponds to the thickness direction of the door 7, i.e., the horizontal direction in FIG. 1. The structures of the pressure sensor 1A other than the above are similar to those of the pressure sensor 1 of the first embodiment. Therefore, the descriptions thereof are not repeated.

In the present embodiment, the first sensor chip 12 and the second sensor chip 14 are arranged next to each other in an expanding direction of the first diaphragm 12b and the second diaphragm 14b, that is, in a direction parallel to the planar direction of the first diaphragm 12b and the second diaphragm 14b.

Therefore, the height of the pressure sensor 1A, that is, the dimension of the pressure sensor 1A in the up and down direction in FIG. 6 can be reduced, as compared with the pressure sensor 1 of the first embodiment. As such, the pressure sensor 1A can be easily installed inside of the door 7, which is limited to a small space.

For example, in a case where the space inside of the door 7 has more allowance in the up and down direction than in the thickness direction (horizontal direction of the vehicle), the pressure sensor 1A can be easily arranged in the door 7 such that the expanding direction (the horizontal direction in FIG. 6) of the pressure sensor 1A coincides with the up and down direction of the door 7, and the height of the pressure sensor 1A (the up and down direction in FIG. 6) coincides with the thickness direction of the door 7.

Third Embodiment

Figure 7:
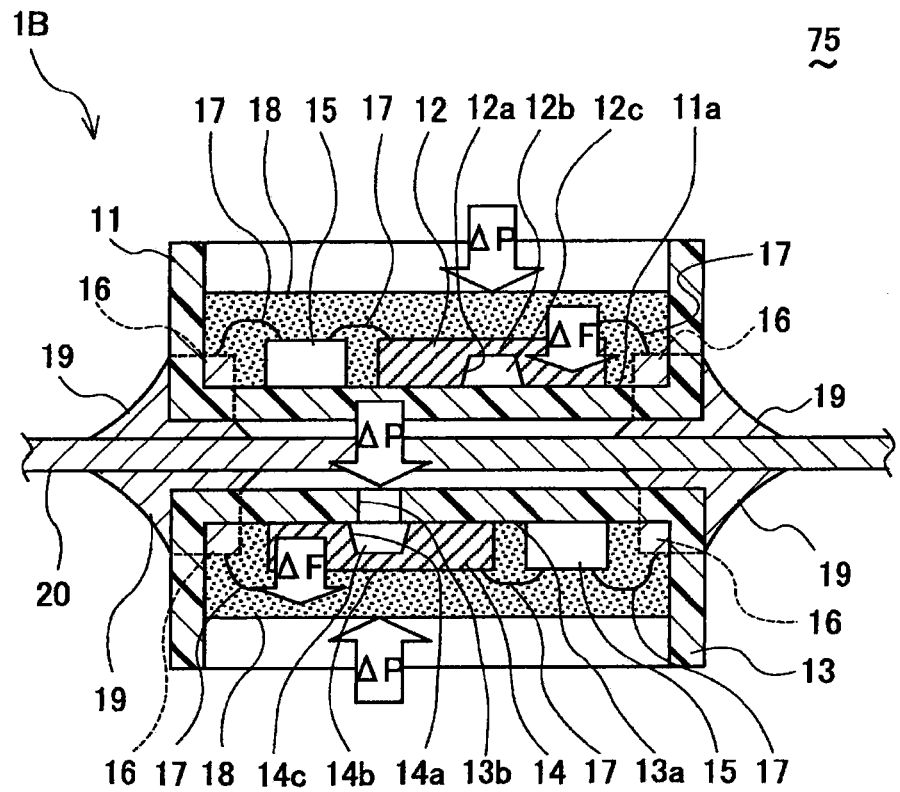
FIG. 7 is a cross-sectional view of a pressure sensor according to a third embodiment of the present disclosure.

A pressure sensor 1B according to a third embodiment will be described with reference to FIG. 7. Hereinafter, points different from the pressure sensor 1 of the first embodiment will be mainly described. In FIG. 7, components similar to those of FIG. 2 are designated with the same reference numbers.

In the pressure sensor 1B, the second housing 13 has a chamber communication hole 13b on the bottom wall 13a. The chamber communication hole 13b corresponds to a housing through hole. The chamber communication hole 13b penetrates through the bottom wall 13a of the second housing 13 to allow communication between the second chamber 14c and the closed chamber 75. In the present embodiment, the other structures of the pressure sensor 1B are similar to those of the pressure sensor 1 of the first embodiment. Therefore, description thereof will not be repeated.

In the present embodiment, the second chamber 14c and the closed chamber 75 are in communication with each other through the chamber communication hole 13b. The pressure generated in the closed chamber 75 is also introduced into the second chamber 14c, and the second diaphragm 14d is not deformed by the pressure generated in the closed chamber 75.

Therefore, when the change in pressure occurs in the closed chamber 75, the first sensor chip 12 outputs the detection value in which the change in pressure of the closed chamber 75 and the components of the impulsive vibrations of the first diaphragm 12b and the protection member 18 covering the protection member 18 are mixed. The second sensor chip 14 outputs the detection value containing the components of the impulsive vibrations of the second diaphragm 14b and the protection member 18 covering the second diaphragm 14b. In the detection value of the first sensor chip 12 and the detection value of the second sensor chip 14, the component of the impulsive vibrations of the first diaphragm 12b and the protection member 18 and the component of the impulsive vibrations of the second diaphragm 14b and the protection member 18 are same in magnitude but have opposite signs.

Therefore, only by adding the detection value of the first sensor chip 12 and the detection value of the second sensor chip 14, that is, without dividing the sum of the detection value of the first sensor chip 12 and the detection value of the second sensor chip 14 by two, the influence by the impulsive vibrations can be removed from the detection values of the first sensor chip 12 and the second sensor chip 14, and the change in pressure generated in the closed chamber 75 can be detected.

Therefore, a calculation process of calculating the change in pressure generated in the closed chamber 75 can be simplified, and the circuit chip 15 can be reduced in size and weight.

The chamber communication hole 13b is formed in the bottom wall 13a of the second housing 13 to allow communication between the second chamber 14c and the closed chamber 75. The chamber communication hole 13b can be formed at the same time as forming the second housing 13. Therefore, the pressure sensor 1B can be easily produced.

Fourth Embodiment

Figure 8:
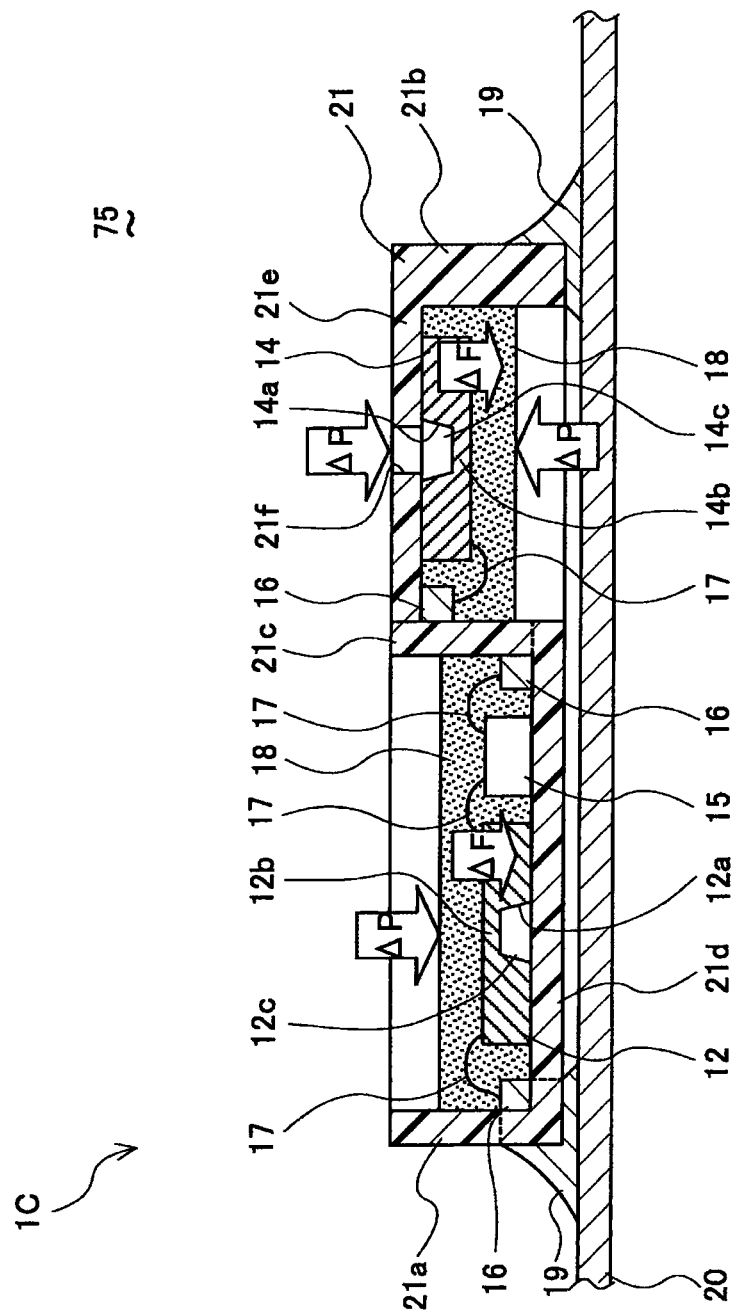
FIG. 8 is a cross-sectional view of a pressure sensor according to a fourth embodiment of the present disclosure.

Next, a pressure sensor 1C according to a fourth embodiment of the present disclosure will be described with reference to FIG. 8. Hereinafter, points different from the pressure sensor 1A of the second embodiment will be mainly described. In FIG. 8, components similar to those of FIG. 6 are designated with the same reference numbers.

In the pressure sensor 1C of the present embodiment, a chamber communication hole 21f is formed in the top wall 21e of the sensor housing 21. The chamber communication hole 21f corresponds to the housing through hole. The chamber communication hole 21f penetrates through the top wall 21e of the sensor housing 21. The chamber communication hole 21f allows communication between the second chamber 14c and the closed chamber 75.

The other structures of the pressure sensor 1C are similar to those of the pressure sensor 1A of the second embodiment. In the pressure sensor 1C, the change in pressure generated in the closed chamber 75 is detected in the similar manner to the pressure sensor 1B of the third embodiment. Therefore, descriptions thereof are not repeated.

Fifth Embodiment

Figure 9:
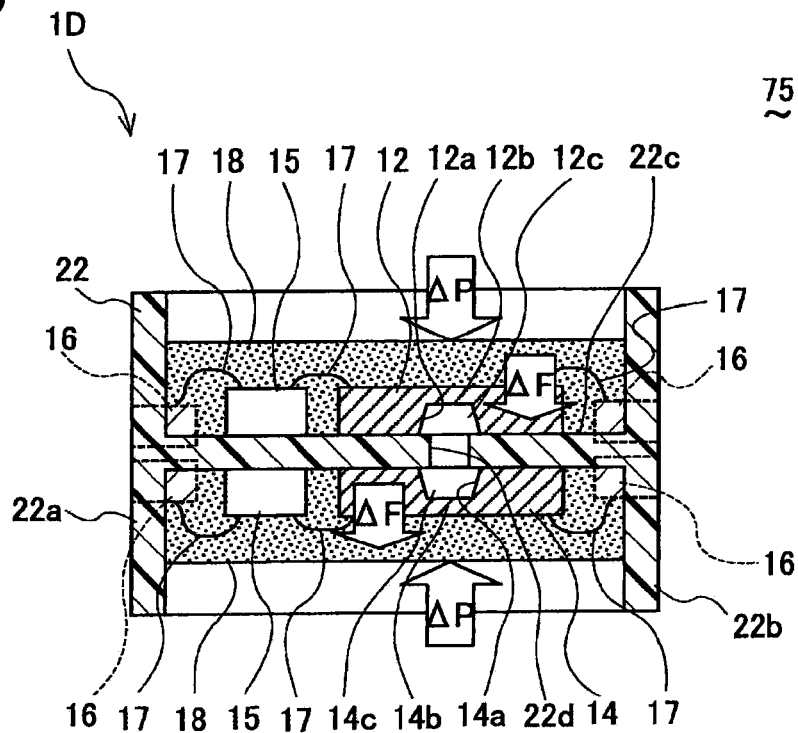
FIG. 9 is a cross-sectional view of a pressure sensor according to a fifth embodiment of the present disclosure.

Next, a pressure sensor 1D according to a fifth embodiment of the present disclosure will be described with reference to FIG. 9. Hereinafter, points different from the pressure sensor 1 of the first embodiment will be mainly described. In FIG. 9, structures similar to those of FIG. 2 are designated with the same reference numbers.

In the description of the structures of the pressure sensor 1D, for the convenience of explanation, an upper side in FIG. 9 is referred to as an upper side of the pressure sensor 1D, and a lower side in FIG. 9 is referred to as a lower side of the pressure sensor 1D. However, the upper side and the lower side are irrelevant to an actual fixing direction of the pressure sensor 1D to the vehicle 6. In FIG. 9, illustration of the solder 19 and the sensor substrate 20 are omitted.

The pressure sensor 1D has a sensor housing 22 that is integrally formed of a synthetic resin material. As shown in FIG. 9, the sensor housing 22 has a pair of side walls 22a, 22b and a separation wall 22c. The side walls 22a, 22b are opposed to each other in a horizontal direction of FIG. 9. The separation wall 22c extends in the horizontal direction of FIG. 9 and connects a middle portion of the side wall 22a and a middle portion of the side wall 22b.

The first sensor chip 12 having the first diaphragm 12b is fixed to a first surface of the separation wall 22c, such as an upper surface of the separation wall 22c in FIG. 9. The first chamber 12c is provided between the upper surface of the separation wall 22c and the first diaphragm 12b. As shown in FIG. 9, the first chamber 12c is isolated from the closed chamber 75.

The second sensor chip 14 having the second diaphragm 14b is fixed to a second surface of the separation wall 22c, such as a lower surface of the separation wall 22c in FIG. 9. The second chamber 14c is provided between the lower surface of the separation wall 22c and the second diaphragm 14b. The second chamber 14c is opposite to the first chamber 12c with respect to the separation wall 22c. As shown in FIG. 9, the second chamber 14c is isolated from the closed chamber 75.

On the upper surface of the separation wall 22c, the circuit chip 15 is arranged. The circuit chip 15 and the first sensor chip 12 are arranged in the horizontal direction of FIG. 9, such as in a planar direction of the separation wall 22c. The plurality of electrodes 16 is disposed at the corner portions of the separation wall 22c. The bonding wires 17 connect between the electrodes 16 and the first sensor chip 12, between the electrodes 16 and the circuit chip 15, and between the first sensor chip 12 and the circuit chip 15.

The protection member 18 is filled in the sensor housing 22 to cover the first sensor chip 12, the circuit chip 15, the electrodes 16 and the bonding wires 17, which are disposed on the upper surface of the separation wall 22c, from the top.

The circuit chip 15 is also disposed on the lower surface of the separation wall 22c. The circuit chip 15 and the second sensor chip 14 are arranged in the horizontal direction of FIG. 9, such as in the planar direction of the separation wall 22c. The plurality of electrodes 16 is also disposed at the corner portions of the lower surface of the separation wall 22c. The bonding wires 17 connect between the electrode 16 and the second sensor chip 14, between the electrode 16 and the circuit chip 15, and between the second sensor chip 14 and the circuit chip 15.

The protection member 18 is filled in the sensor housing 22 to cover the second sensor chip 14, the electrodes 16 and the bonding wires 17, which are disposed on the lower surface of the separation wall 22c, from the bottom. As shown in FIG. 9, the separation wall 22c is formed with a sensor connection hole 22d. The sensor connection hole 22d penetrates through the separation wall 22c in the up and down direction of FIG. 9. The first chamber 12c and the second chamber 14c are in communication with each other through the sensor connection hole 22d, and thus the first chamber 12c and the second chamber 14c are integrated with each other. In other words, the first chamber 12c and the second chamber 14c are integrated into a single chamber. In the present embodiment, the other structures of the pressure sensor 1D are similar to those of the pressure sensor 1 of the first embodiment. Therefore, description thereof will not be repeated.

In the present embodiment, the first chamber 12c and the second chamber 14c are in communication with each other, and are formed into one chamber. Therefore, the entirety of the pressure sensor 1D can be reduced in size.

Sixth Embodiment

Figure 10:
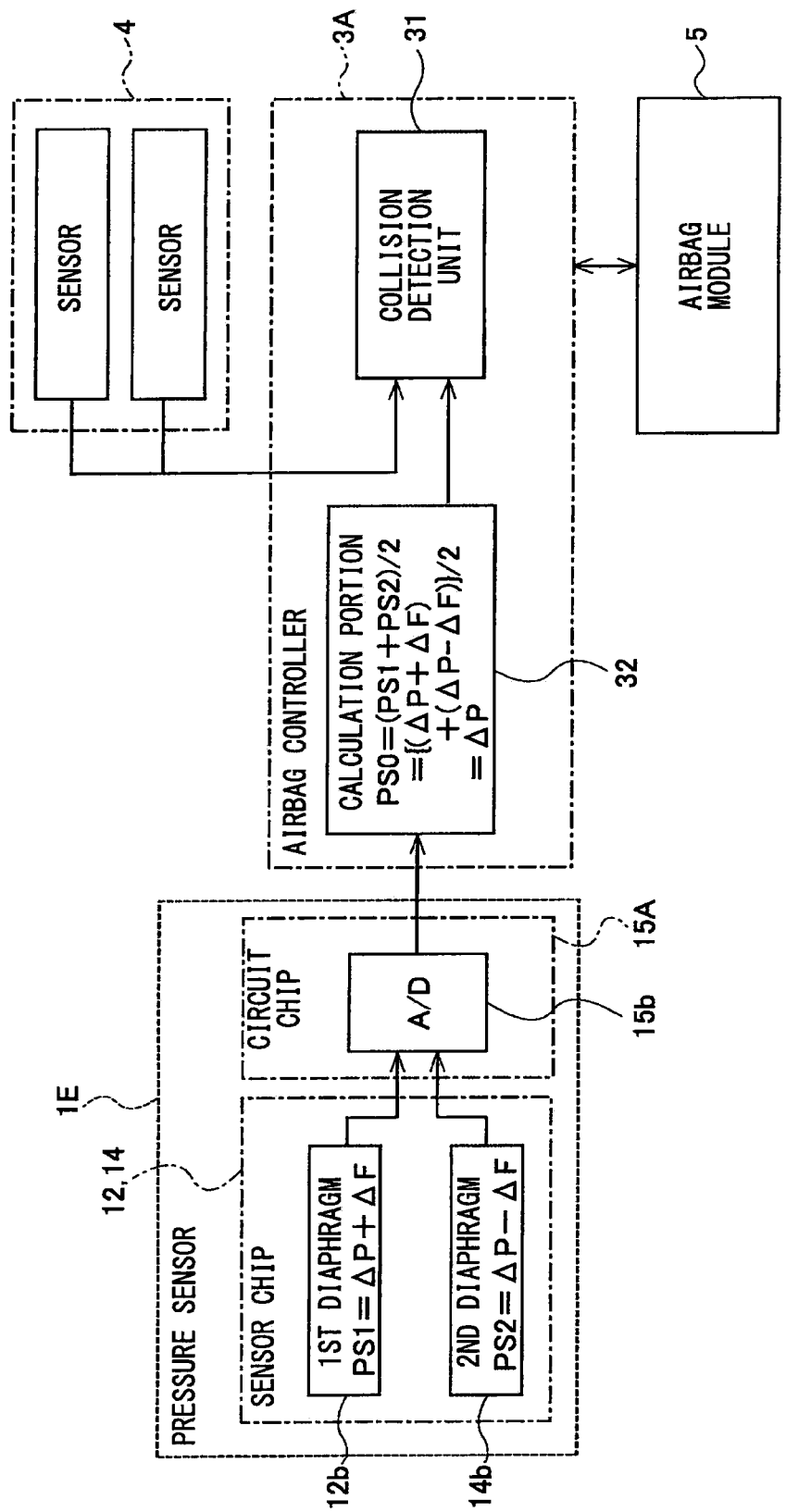
FIG. 10 is a schematic block diagram of an airbag system including a pressure sensor according to a sixth embodiment of the present disclosure.

Next, an airbag system including a pressure sensor 1E according to a sixth embodiment of the present disclosure will be described with reference to FIG. 10. Hereinafter, points different from the first embodiment will be mainly described. In FIG. 10, components similar to the structures of FIG. 5 are designated with the same reference numbers.

The pressure sensor 1E is different from the pressure sensor 1 of the first embodiment only on a point that a circuit chip 15A connected to the first sensor chip 12 and the second sensor chip 14 does not include the circuit portion 15a. Instead, an airbag controller 3A includes a calculation portion 32 having similar functions to those of the circuit portion 15a of the first embodiment. The calculation portion 32 is connected to the A/D converter 15b of the circuit chip 15A, and the collision detection unit 31 of the airbag controller 3A.

In this case, the detection value PS1 by the first diaphragm 12b and the detection value PS2 by the second diaphragm 14b are digitalized by the A/D converter 15b, and then transmitted to the airbag controller 3A. In the calculation portion 32, the detection value PS1 and the detection value PS2 are added to each other, and then divided by two.

The other structures of the airbag system according to the present embodiment are similar to the airbag system of the first embodiment. Therefore, the description thereof will not be repeated.

In the present embodiment, the circuit chip 15A does not have the circuit portion 15a. Therefore, the circuit chip 15A can be reduced in size. With this, the pressure sensor 1E can be reduced in size.

Other Embodiments

The present disclosure are not limited to the embodiments described hereinabove, but may be modified or expanded in various other ways, for example in the following manners.

Use of the pressure sensors 1 to 1E may be limited to detect a collision to the side door 7. The pressure sensors 1 to 1E may be adaptable to detect a collision to a rear door of the vehicle 6, in addition to the side door 7.

The pressure sensors 1 to 1E may be used for any purpose other than the detection of a collision to the vehicle 6. Namely, the pressure sensor of the present disclosure may be used to detect various types of pressure generated in a vehicle.

In the pressure sensors 1 to 1E, when the first diaphragm 12b and the second diaphragm 14b are applied with the same impulsive vibrations (e.g., the impulsive vibrations in the same direction and with the same magnitude), the first sensor chip 12 and the second sensor chip 14 output the detection values that are same in magnitude but have opposite signs. The detection value of the first diaphragm 12b and the detection value of the second diaphragm 14b may have some variations as long as the variations do not affect in the removal of the influence by the impulsive vibrations from the detection values when the detection value of the first diaphragm 12b and the detection value of the second diaphragm 14b are added.

While only the selected exemplary embodiment and examples have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiment and examples according to the present disclosure is provided for illustration only, and not for the purpose of limiting the disclosure as defined by the appended claims and their equivalents.

What is claimed is:

1. A pressure detecting device comprising:
   a sensor housing;
   a first detection member including a first diaphragm, the first detection member being fixed to the sensor housing such that a first surface of the first diaphragm faces a closed space and a first chamber being isolated from the closed space is provided to face a second surface of the first diaphragm, the first detection member outputting a signal when the first diaphragm is deformed according to a pressure in the closed space;
   a second detection member including a second diaphragm, the second detection member being fixed to the sensor housing such that a first surface of the second diaphragm faces the closed space and a second chamber is provided to face a second surface of the second diaphragm, the second detection member outputting a signal having an absolute value the same as an absolute value of the signal outputted from the first detection member but having an opposite positive or negative sign from that of the signal outputted from the first detection member, when the second diaphragm is deformed by a same amount and in a same direction as the first diaphragm; and
   at least one protection member being filled in the sensor housing and covering the first surface of the first diaphragm and the first surface of the second diaphragm.

2. The pressure detecting device according to claim 1, wherein
   the first detection member and the second detection member are arranged in a direction parallel to a planar direction of the first diaphragm and the second diaphragm.

3. The pressure detecting device according to claim 1, wherein
   the second chamber is in communication with the closed space.

4. The pressure detecting device according to claim 3, wherein
   the second chamber is provided between the second surface of the second diaphragm and the sensor housing, and
   the sensor housing is formed with a housing communication hole that allows communication between the second chamber and the closed space.

5. The pressure detecting device according to claim 1, wherein
   the first chamber and the second chamber are in communication with each other, and are integral with each other.

6. The pressure detecting device according to claim 1, further comprising:
   a calculation circuit that adds a detection value of the first detection member and a second detection value of the second detection member.

7. The pressure detecting device according to claim 1, wherein
   the closed space is provided inside of a door of a vehicle, and
   an increase in the pressure in the closed space is detected according to a compression of the closed space in an event of a collision to the door.

8. A pressure detecting device comprising:
   a sensor housing;
   a first detection member including a first diaphragm, the first detection member being fixed to the sensor housing such that a first surface of the first diaphragm faces a first direction and a first chamber is provided to face a second surface of the first diaphragm, the first detection member outputting a signal when the first diaphragm is deformed;
   a second detection member including a second diaphragm, the second detection member being fixed to the sensor housing such that a first surface of the second diaphragm faces a second direction opposite the first direction and a second chamber is provided to face a second surface of the second diaphragm, the second detection member outputting a signal having an absolute value the same as an absolute value of the signal outputted from the first detection member but having an opposite positive or negative sign from that of the signal outputted from the first detection member, when the second diaphragm is deformed by a same amount in a same direction as the first diaphragm; and
   at least one protection member being filled in the sensor housing and covering the first surface of the first diaphragm and the first surface of the second diaphragm.

9. The pressure detecting device according to claim 8, wherein
   the first detection member and the second detection member are arranged in a direction parallel to a planar direction of the first diaphragm and the second diaphragm.

10. The pressure detecting device according to claim 8, wherein
    the first chamber and the second chamber are in communication with each other, and are integral with each other.

11. The pressure detecting device according to claim 8, further comprising:
    a calculation circuit that adds a detection value of the first detection member and a second detection value of the second detection member.

* * * * *